(12) United States Patent
Wang et al.

(10) Patent No.: US 7,453,294 B1
(45) Date of Patent: Nov. 18, 2008

(54) DYNAMIC FREQUENCY DIVIDER WITH IMPROVED LEAKAGE TOLERANCE

(75) Inventors: Shoujun Wang, Kanata (CA); Haitao Mei, Kanata (CA); Bill Bereza, Nepean (CA)

(73) Assignee: Altera Corporation, San Jose, CA (US)

( * ) Notice: Subject to any disclaimer, the term of this patent is extended or adjusted under 35 U.S.C. 154(b) by 25 days.

(21) Appl. No.: 11/169,955

(22) Filed: Jun. 28, 2005

(51) Int. Cl.
*H03B 19/00* (2006.01)
*H03K 3/289* (2006.01)

(52) U.S. Cl. .................. 327/117; 327/212; 327/202; 377/47

(58) Field of Classification Search ......... 327/114–118, 327/122, 200–205, 306, 333, 212; 377/47, 377/48
See application file for complete search history.

(56) References Cited

U.S. PATENT DOCUMENTS

| | | | | |
|---|---|---|---|---|
| 4,845,727 A | * | 7/1989 | Murray | 377/43 |
| 5,036,217 A | * | 7/1991 | Rollins et al. | 327/203 |
| 6,107,853 A | * | 8/2000 | Nikolic et al. | 327/217 |
| 6,459,317 B1 | * | 10/2002 | Lu et al. | 327/217 |
| 6,633,188 B1 | * | 10/2003 | Jia et al. | 327/217 |
| 6,717,448 B2 | * | 4/2004 | Heo et al. | 327/202 |
| 7,091,756 B2 | * | 8/2006 | Collier et al. | 327/115 |
| 7,102,391 B1 | * | 9/2006 | Sun et al. | 327/10 |

OTHER PUBLICATIONS

Borivoje Nikolić et al., "Improved Sense-Amplifier-Based Flip-Flop: Design and Measurements," IEEE Journal of Solid-State Circuits, vol. 35, No. 6, pp. 876-884, Jun. 2000.
Kaushik Roy et al., "Leakage Current Mechanisms and Leakage Reduction Techniques in Deep-Submicrometer CMOS Circuits," Proceedings of The IEEE, vol. 91, No. 2, pp. 305-327, Feb. 2003.

* cited by examiner

*Primary Examiner*—Dinh T. Le
(74) *Attorney, Agent, or Firm*—Ropes & Gray LLP; Robert R. Jackson; Chia-Hao La

(57) ABSTRACT

A dynamic frequency divider circuit with improved leakage tolerance supports a wide frequency range. During the evaluation phase, (1) the input signals can be prevented from changing states, (2) the leakage can be reduced, or (3) both can be implemented to generate the correct output signals. In a architecture-level approach, two dynamic flip-flops can be coupled together. In a circuit-level approach, the dynamic flip-flop can include (1) two additional clocked PMOS transistor added to the inputs of the dynamic flip-flop, or (2) two additional pull-up PMOS transistors to counteract the sub-threshold leakage in the NMOS transistors.

10 Claims, 9 Drawing Sheets

DYNAMIC FREQUENCY DIVIDER WITH IMPROVED LEAKAGE TOLERANCE

BACKGROUND OF THE INVENTION

The invention relates to dynamic frequency dividers. More particularly, the invention relates to dynamic frequency dividers with improved leakage tolerance.

Frequency dividers are widely used in high-performance designs in complementary metal oxide semiconductor (CMOS) technology. Two types of frequency dividers include static frequency dividers and dynamic frequency dividers. A static frequency divider, built from a static flip-flop, can typically only operate at low frequencies. A dynamic frequency divider, built from a dynamic flip-flop, can typically only operate at high frequencies.

A static frequency divider is commonly combined with a dynamic frequency divider in order to provide a combined circuit that can operate over a wider frequency range. The combined circuit is partitioned so that for certain operating frequencies (e.g., high frequencies), data is processed by the dynamic frequency divider, while for other operating frequencies (e.g., low frequencies), data is processed by the static frequency divider. Even with this combined circuit, the range of operating frequencies is limited. In addition, the combined circuit requires additional area for the two frequency dividers and also results in overlapping circuitry.

A dynamic frequency divider operates in a frequency range from a minimum frequency ($F_{MIN}$) to a maximum frequency ($F_{max}$). The dynamic frequency divider can be built from a dynamic flip-flip such as, for example, a sense amplifier based flip-flop (SAFF).

CMOS technology scaling is performed in order to provide enhanced speed while maintaining acceptable power consumption by reducing the threshold voltage and supply voltage. For a dynamic frequency divider, CMOS technology scaling causes the maximum frequency to increase. But this also causes the minimum frequency to increase because of leakage across the transistors. There are two types of leakage: subthreshold leakage and gate leakage. Subthreshold leakage, which is the more dominant leakage, occurs because of the decreasing threshold voltage. Gate leakage occurs because of the increasing thinness of the gate oxide. As the threshold voltage decreases and the gate oxide becomes thinner, the transistor continues to conduct current even when the transistor is in the OFF state, thus causing the minimum operating frequency to increase.

It would therefore be desirable to provide a dynamic frequency divider circuit with improved leakage tolerance that can operate over a wide frequency range.

SUMMARY OF THE INVENTION

In accordance with the invention a dynamic frequency divider circuit with improved leakage tolerance that can operate over a wide frequency range. The dynamic frequency divider circuit includes at least one dynamic flip-flop that operates in two phases: a precharge phase and an evaluation phase. During the precharge phase, the internal nodes are charged to a supply voltage. During the evaluation phase, depending on the differential input signals, one of the internal nodes is discharged to ground while the other internal node is held at the supply voltage.

In one embodiment, the input data is prevented from changing states for one clock period so that, even if leakage occurs during the evaluation phase, the internal states can be held to generate the correct output data. This can be achieved using an architecture-level approach or a circuit-level approach.

In the architecture-level approach, two dynamic flip-flops (e.g., sense amplifier based flip-flops) with interleaved clocking can be coupled together. The outputs of the first dynamic flip-flop are sent as inputs to the second dynamic flip-flop. The outputs of the second dynamic flip-flop are inverted and fed back to the inputs of the first dynamic flip-flop. The outputs of the second dynamic flip-flop, and therefore the inputs of the first dynamic flip-flop, do not change state for one clock period.

In the circuit-level approach, two additional clocked positive-channel metal oxide semiconductor (PMOS) transistors are added to the dynamic flip-flop. A clocked PMOS transistor can be coupled to each data input to prevent the internal states from changing during the evaluation phase.

In another embodiment, the leakage effect can be reduced so that, even if the input data change states during the evaluation phase, the internal states can be held to generate the correct output data. This can be achieved in a circuit-level approach by adding two additional pull-up PMOS transistors to the dynamic flip-flop. A pull-up PMOS transistor can be coupled across each side of a cross-coupled inverter in the dynamic flip-flop to counteract any leakage attributable to the negative-channel metal oxide semiconductor (NMOS) transistors.

Each embodiment can be implemented independently from, or in combination with, the other embodiment.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
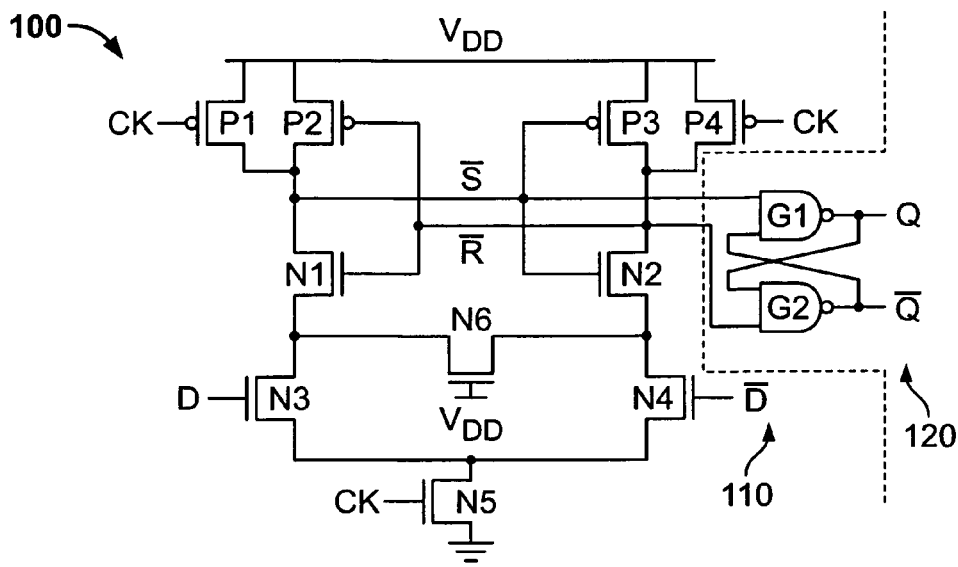
FIGS. 1-2 are circuit diagrams of conventional sense amplifier based flip-flops (SAFFs)

FIG. 1 is a circuit diagram of a sense amplifier based flip-flop (SAFF) 100. SAFF 100 includes a sense amplifier (SA) 110 coupled to a set-reset (SR) latch 120. Sense amplifier 110 receives a pair of differential input signals D and DB and amplifies the difference between the signals to produce differential output signals at nodes SB and RB. SR latch 120 captures the differential output signals at nodes SB and RB and holds the state until a next leading clock edge.

SAFF 100 has two phases: a precharge phase and an evaluation phase. The precharge phase occurs when the clock signal CK is low (i.e., binary "0"). During the precharge phase, nodes SB and RB are charged to a supply voltage $V_{DD}$ by the clocked positive-channel metal-oxide semiconductor (PMOS) transistors P1 and P4. The evaluation phase occurs when the clock signal CK is high (i.e., binary "1"). During the evaluation phase, depending on the differential input signals D and DB, one of the nodes (SB or RB) is discharged to ground while the other node (RB or SB) is held at $V_{DD}$. For example, if D is high and DB is low, node SB is discharged to ground via the path at negative-channel metal-oxide semiconductor (NMOS) transistors N1, N3, and N5 (NMOS transistor N2 is turned OFF) and node RB is held at $V_{DD}$ via the path at PMOS transistor P3. If D is low and DB is high, node RB is discharged to ground via the path at NMOS transistors N2, N4, and N5 (NMOS transistor N1 is turned OFF) and node SB is held at $V_{DD}$ via the path at PMOS transistor P2. The cross-coupled inverters in sense amplifier 110 (i.e., transistors N1, P2, N2, and P3) provide the required high gain and serve as "keeper" against subthreshold leakage current and coupled noise. The size of the "keeper" devices involves a trade-off between evaluation speed and leakage or noise immunity.

SR latch 120 captures the differential output signals at nodes SB and RB and holds the state. When SB is low and RB is high, the output Q is set high, which causes QB to be set low. When RB is low and SB is high, the output QB is set high, which causes Q to be set low. SR latch 120 holds the state of Q and QB until a next leading clock edge.

Figure 2:
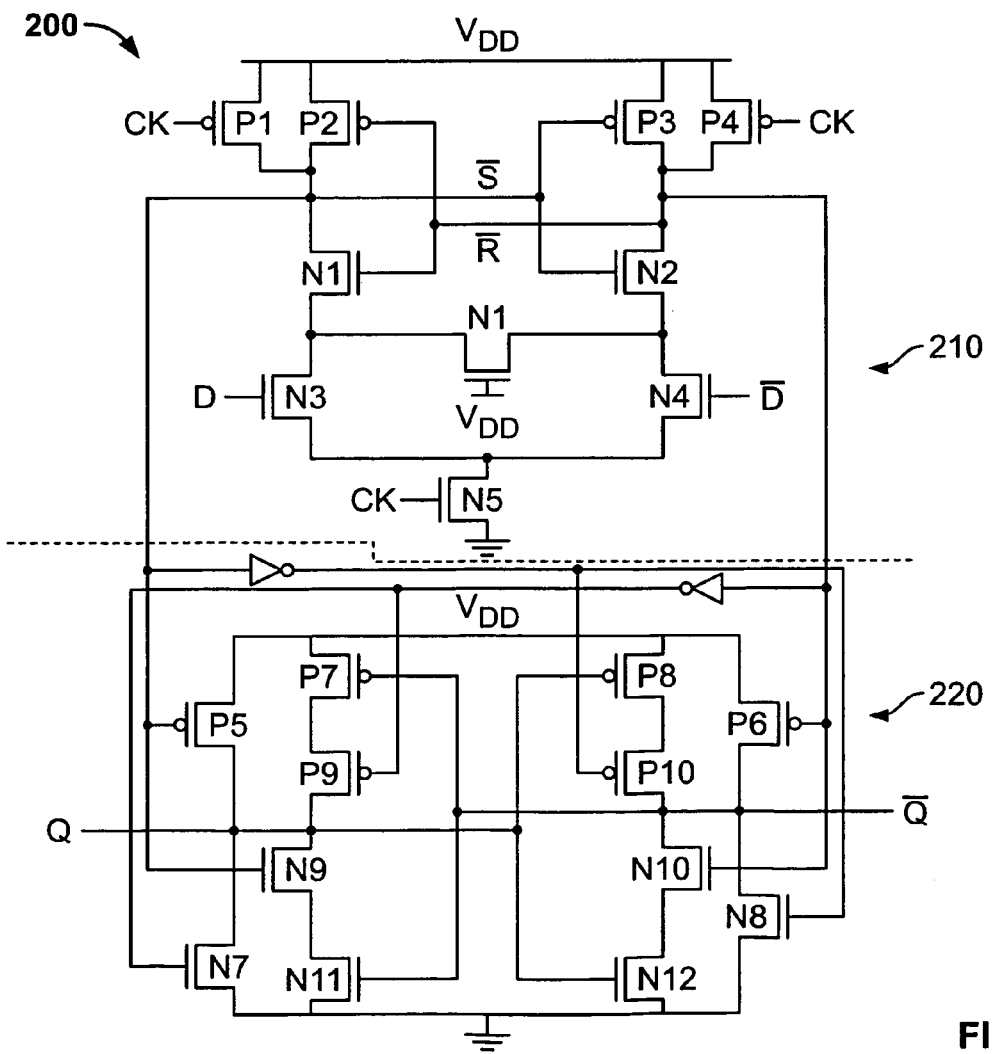

FIG. 2 is a circuit diagram of another SAFF 200. SAFF 200 includes a sense amplifier 210 (which is the same as sense amplifier 110) coupled to another SR latch 220. SR latch 220 includes additional circuitry to generate more symmetrical outputs Q and QB.

Figure 3:
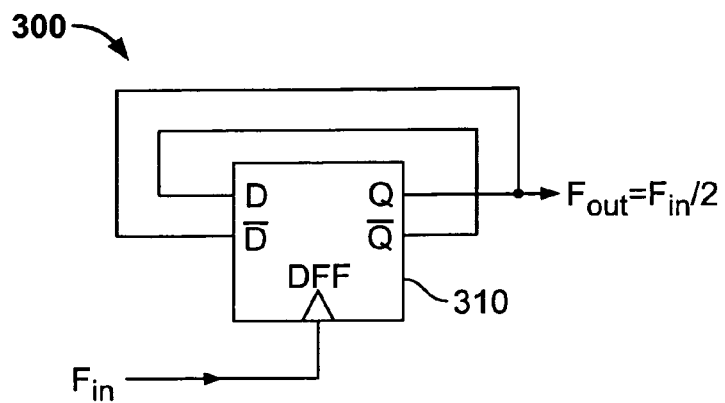
FIG. 3 is a simplified block diagram of a frequency divider circuit in accordance with an embodiment of the invention.

FIG. 3 is a simplified block diagram of a dynamic frequency divider circuit 300. Circuit 300 can be built from a dynamic SAFF 310 (e.g., SAFF 100 or 200). A signal whose frequency is to be divided is sent as input to SAFF 310 as the clock signal $F_{IN}$ (e.g., signal CK in FIGS. 1-2). There are feedback loops that couple the outputs of SAFF 310 to the inputs of SAFF 310. The output Q is coupled to the input DB while the output QB is coupled to the input D. SAFF 310 generates a signal at output Q having a frequency that is half the frequency of clock signal $F_{IN}$ (i.e., $F_{out}=F_{IN}/2$).

The time needed for outputs Q and QB to be fed back to the respective inputs DB and D of SAFF 310 is known as the clock-to-output delay (tcq). When SAFF 310 enters the evaluation phase, inputs D and DB change states because of the signals generated at outputs Q and QB. Because SAFF 310 has a hold time of the clock-to-output delay, the transition times for the clock signal should be less than the clock-to-output delay so that the states of inputs D and DB are properly captured before inputs D and DB change states (i.e., before the signals from outputs Q and QB are fed back to respective inputs DB and D). When the inputs D and DB change states during the evaluation phase and when subthreshold leakage occurs, the captured states cannot be held, thereby generating incorrect output data Q and QB.

Dynamic frequency divider circuit 300 causes a serious leakage-induced limitation on the minimum operating frequency $F_{MIN}$. For example, a dynamic SAFF divider, implemented in 90 nanometers (nm), has a minimum operating frequency of about 1 Gigahertz (GHz). For frequencies below the minimum operating frequency, and after SAFF 310 enters into the evaluation phase, SB and RB cannot hold their states because of hold time violations and subthreshold leakage. The larger the leakage, the larger the minimum operating frequency. Although the "keeper" size of the transistors can help lower the minimum operating frequency, this also causes the maximum operating frequency to be lowered.

Figure 4:
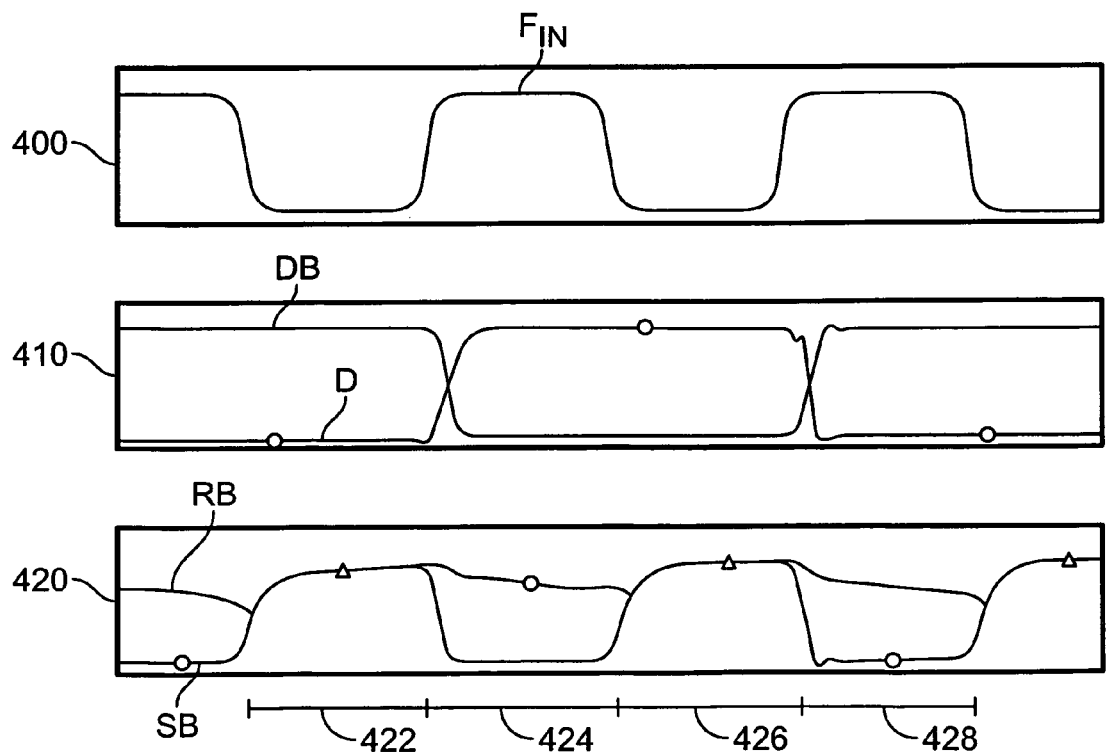
FIGS. 4-5 show timing diagrams of the conventional SAFFs in the frequency divider circuit of FIG. 3.
Figure 5:
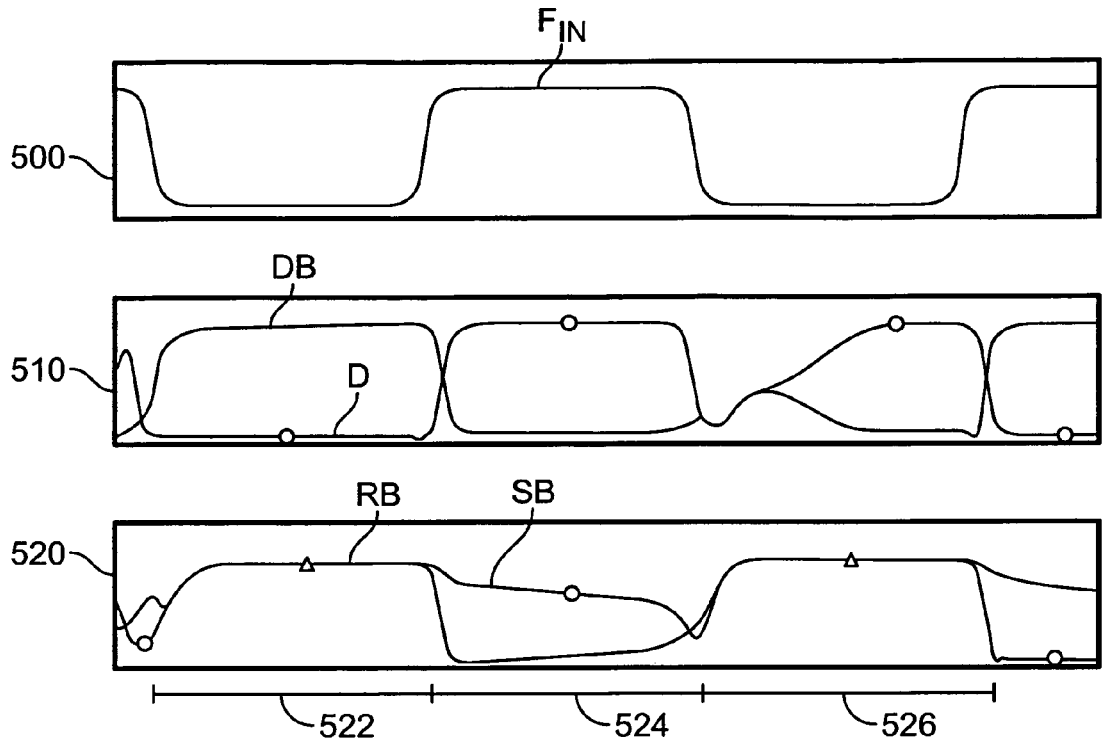

FIGS. 4 and 5 are timing diagrams for SAFF 310 (using SAFFs 100 or 200) in the dynamic frequency divider circuit 300. FIG. 4 shows timing diagrams when the frequency is greater than the minimum operating frequency (e.g., $F_{IN}=1.5$ GHz). Diagram 400 shows the clock signal $F_{IN}$. Diagram 410 shows the differential input/feedback signals D and DB. Diagram 420 shows the signals at nodes RB and SB. When $F_{IN}$ is low, SAFF 310 is in the precharge phase and signals RB and SB are charged to the supply voltage $V_{DD}$ (e.g., at 422 and 426). When $F_{IN}$ is high, SAFF 310 is in the evaluation phase. When DB is high and D is low, at the next rising edge of $F_{IN}$, RB is discharged to ground and SB maintains its high state (e.g., at 424). When D is high and DB is low, at the next rising edge of $F_{IN}$, SB is discharged to ground and RB maintains its high state (e.g., at 428). During the evaluation phase, the signal that maintains its high state has a slight drop in voltage because of leakage across the NMOS transistors while the signal that is discharged to ground has a slight rise in voltage because of leakage across the PMOS transistors. However, because $F_{IN}$ is greater than the minimum operating frequency, SAFF 310 switches from the evaluation phase back to the precharge phase before the leakage can cause nodes RB and SB to change state.

FIG. 5 shows timing diagrams when the frequency is below the minimum operating frequency (e.g., $F_{IN}=0.9$ GHz). Diagram 500 shows the clock signal $F_{IN}$. Diagram 510 shows the differential input/feedback signals D and DB. Diagram 520 shows the signals at nodes RB and SB. When $F_{IN}$ is low, SAFF 310 is in the precharge phase and signals RB and SB are charged $V_{DD}$ (e.g., at 522 and 526). When $F_{IN}$ is high, SAFF 310 is in the evaluation phase. When DB is high and D is low, at the next rising edge of $F_{IN}$, RB is discharged to ground and SB maintains its high state (e.g., at 524). When D is high and DB is low, at the next rising edge of $F_{IN}$, SB is discharged to ground and RB maintains its high state. During the evaluation phase, the signal that maintains its high state has a large drop in voltage because of leakage across the NMOS transistors while the signal that is discharged to ground has a large rise in voltage because of leakage across the PMOS transistors. Because $F_{IN}$ is less than the minimum operating frequency, by the time SAFF 310 switches from the evaluation phase back to the precharge phase, the leakage causes nodes RB and SB to change states, thereby affecting the outputs Q and QB and inputs D and DB.

In accordance with the invention a dynamic frequency divider circuit with improved leakage tolerance is provided that can operate at low and high frequencies over a wide frequency range. As shown above, when the inputs D and DB change states during the evaluation phase and when subthreshold leakage occurs, the nodes RB and SB cannot maintain their states. But if inputs D and DB maintain their states during the evaluation phase, even if leakage occurs, the nodes RB and SB would be able to maintain their states. Also, if leakage is reduced, even if the inputs D and DB change states during the evaluation phase, the nodes RB and SB would be able to maintain their states.

In one embodiment, the input data is prevented from changing states for one clock period so that, even if leakage occurs during the evaluation phase, the internal states can be held to generate the correct output data. This can be achieved using an architecture approach or a circuit-level approach.

In the architecture-level approach, two dynamic flip-flops (e.g., SAFFs) with interleaved clocking can be coupled together. The outputs of the first dynamic flip-flop are sent as inputs to the second dynamic flip-flop. The outputs of the second dynamic flip-flop are inverted and fed back to the inputs of the first dynamic flip-flop. The outputs of the second dynamic flip-flop, and therefore the inputs of the first dynamic flip-flop, do not change state for one clock period.

In the circuit-level approach, two additional clocked positive-channel metal oxide semiconductor (PMOS) transistors are added to a dynamic flip-flop. A clocked PMOS transistor can be coupled to each data input to prevent the inputs to the dynamic flip-flop from changing states for one clock period.

In another embodiment, the leakage effect can be reduced so that, even if the input data change states during the evaluation phase, the internal states can be held to generate the correct output data. This can be achieved in a circuit-level approach by adding two additional pull-up PMOS transistors to a dynamic flip-flop. A pull-up PMOS transistor can be coupled across each side of a cross-coupled inverter in the dynamic flip-flop to counteract any leakage attributable to the negative-channel metal oxide semiconductor (NMOS) transistors.

Each embodiment can be implemented independently from, or in combination with, the other embodiment.

Figure 6:
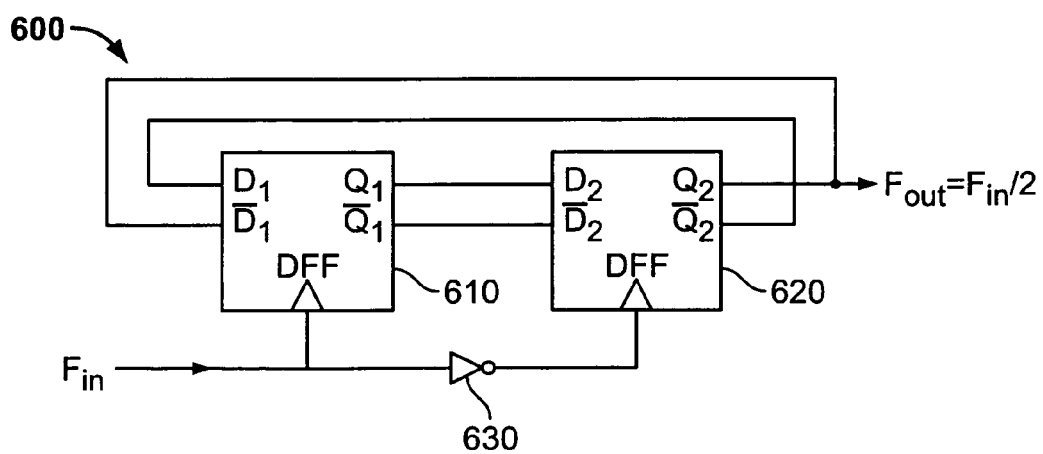
FIG. 6 is a simplified block diagram of a frequency divider circuit in accordance with an embodiment of the invention.

FIG. 6 is a simplified block diagram of a dynamic frequency divider circuit 600 that prevents the input data from changing states for one clock period in accordance with one embodiment of the invention. In the architecture-level approach, circuit 600 can be built from two dynamic flip-flops 610 and 620. Each of dynamic flip-flops 610 and 620 can be any suitable flip-flop or combination of flip-flops including, for example, a SAFF (e.g., SAFF 100 or 200). For clarity, the invention is described herein primarily in the context of using SAFFs for the dynamic frequency divider circuit, although any other suitable dynamic flip-flop or combination of flip-flops may be used.

A signal $F_{IN}$ whose frequency is to be divided is sent as input to flip-flop 610 as the clock signal (e.g., signal CK in FIGS. 1-2). Signal $F_{IN}$ is also sent as input to an inverter 630 so that the complement of signal $F_{IN}$ is sent as input to flip-flop 620 as the clock signal. The outputs $Q_1$ and $QB_1$ of the first flip-flop 610 are coupled to inputs $D_2$ and $DB_2$, respectively, of the second flip-flop 620. There are feedback loops that couple the outputs $Q_2$ and $QB_2$ of the second flip-flop 620 to the inputs $DB_1$ and $D_1$, respectively, of the first flip-flop 610. Circuit 600 generates a signal at output $Q_2$ having a frequency that is one-half the frequency of clock signal $F_{IN}$ (i.e., $F_{out}=F_{IN}/2$).

When one flip-flop 610 (620) is in the precharge phase, the other flip-flop 620 (610) is in the evaluation phase. The outputs $Q_2$ and $QB_2$ of the second flip-flop 620, which are coupled to the inputs $DB_1$ and $D_1$, respectively, of the first flip-flop 610, do not change states for one clock cycle. As a result, even if leakage occurs, the internal nodes maintain their states to generate the correct output data $Q_2$ and $QB_2$.

For clarity, the invention is described herein primarily in the context of a dynamic frequency divider circuit that generates a signal having a frequency that is half the frequency of the clock signal. A dynamic frequency divider circuit that generates a signal having a frequency other than one-half the frequency of the clock signal can also be realized by combining one or more dynamic flip-flops with combinatorial logic (e.g., a finite state machine). The different embodiments of the invention can be applied to a dynamic frequency divider circuit that generates a signal having a frequency that is any suitable multiple of the frequency of the clock signal.

Figure 7:
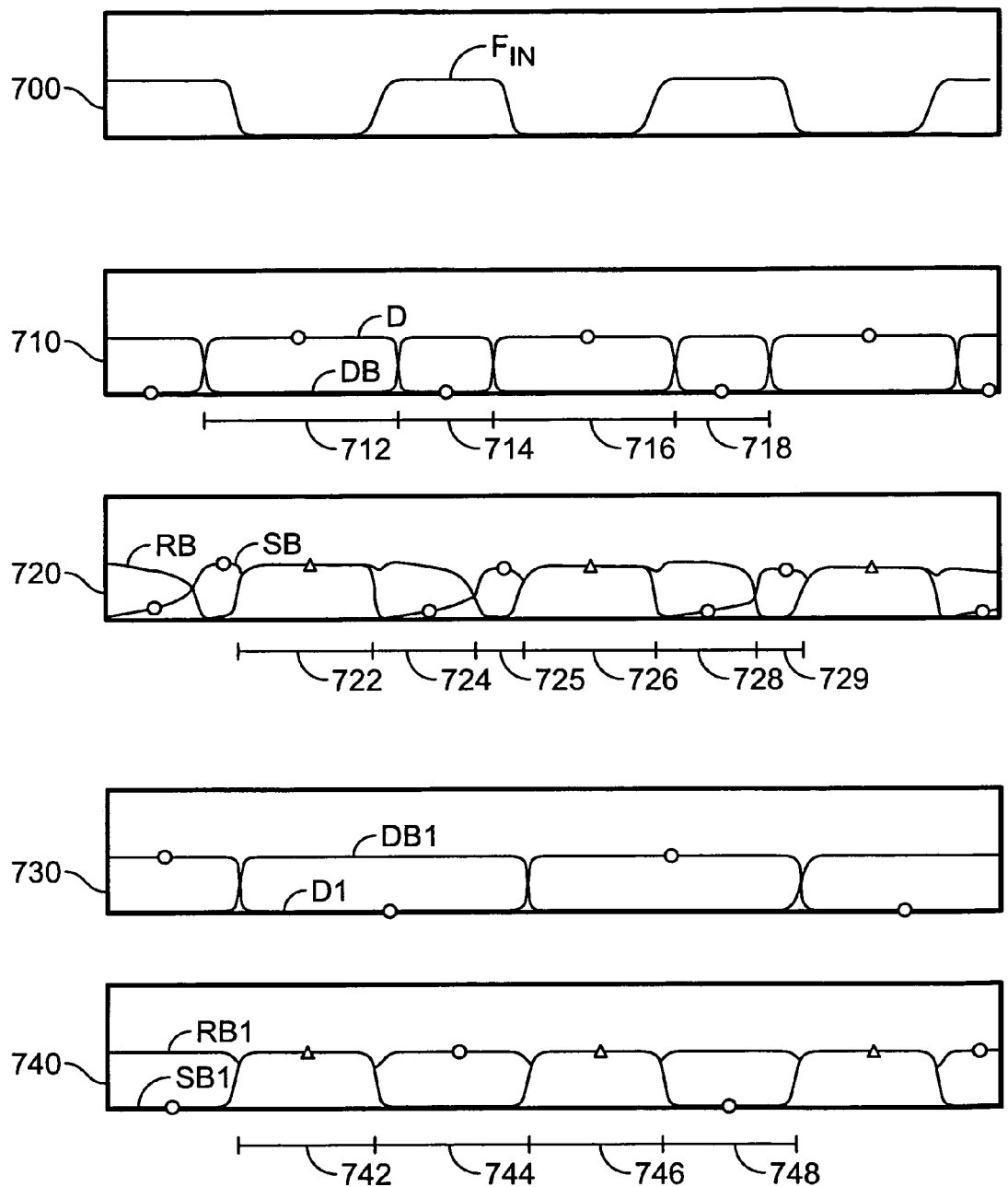
FIGS. 7-8 show timing diagrams of the conventional SAFFs in the frequency divider circuits of FIGS. 3 and 6 in accordance with an embodiment of the invention.

FIG. 7 shows timing diagrams comparing dynamic frequency divider circuit 300 using conventional SAFF 100/200 with the new dynamic frequency divider circuit 600 at a low frequency. Diagram 700 shows the clock signal $F_{IN}$.

Diagrams 710 and 720 show waveforms for circuit 300. Diagram 710 shows the differential input/feedback signals D and DB. Diagram 720 shows the signals at nodes RB and SB. When $F_{IN}$ is low, SAFF 310 is in the precharge phase. Signals D and DB are in a stable state (e.g., at 712 and 716) and signals RB and SB are charged to the supply voltage $V_{DD}$ (e.g., at 722). When $F_{IN}$ is high, SAFF 100/200 is in the evaluation phase. When D is high and DB is low, at the next rising edge of $F_{IN}$, SB is discharged to ground and RB maintains its high state (e.g., at 724 and 728). However, signals D and DB change states during the evaluation phase (e.g., at 714 and 718), causing SB to be charged to the high state and RB to be discharged to ground (e.g., at 725 and 729), and thus affecting the output states of SAFF 100/200. Although not shown, RB and SB follow a similar pattern when D is low and DB is high during the precharge phase, but changes states during the evaluation phase.

Diagrams 730 and 740 show waveforms for circuit 600. Diagram 730 shows the differential input/feedback signals $D_1$ and $DB_1$ for the first flip-flop 610. Diagram 740 shows the signals at nodes $RB_1$ and $SB_1$ for the first flop-flop 610. Although not shown, the signals $D_2$, $DB_2$, $RB_2$, and $SB_2$ for the second flip-flop 620 are the corresponding signals from the first flip-flop 610 shifted by half a clock cycle. When $F_{IN}$ is low, flip-flop 610 is in the precharge phase. Signals $D_1$ and $DB_1$ are in a stable state and signals $RB_1$ and $SB_1$ are charged to the supply voltage $V_{DD}$ (e.g., at 742 and 746). When $F_{IN}$ is high, flip-flop 610 is in the evaluation phase. When $DB_1$ is high and $D_1$ is low, at the next rising edge of $F_{IN}$, $RB_1$ is discharged to ground and $SB_1$ maintains its high state (e.g., at 744). When $D_1$ is high and $DB_1$ is low, at the next rising edge of $F_{IN}$, $SB_1$ is discharged to ground and $RB_1$ maintains its high state (e.g., at 748). With the use of two flip-flops 610 and 620, signals $D_1$ and $DB_1$ maintain their states for one clock cycle (a precharge phase and corresponding evaluation phase), and thus do not affect the output states of flip-flops 610 and 620.

Figure 8:
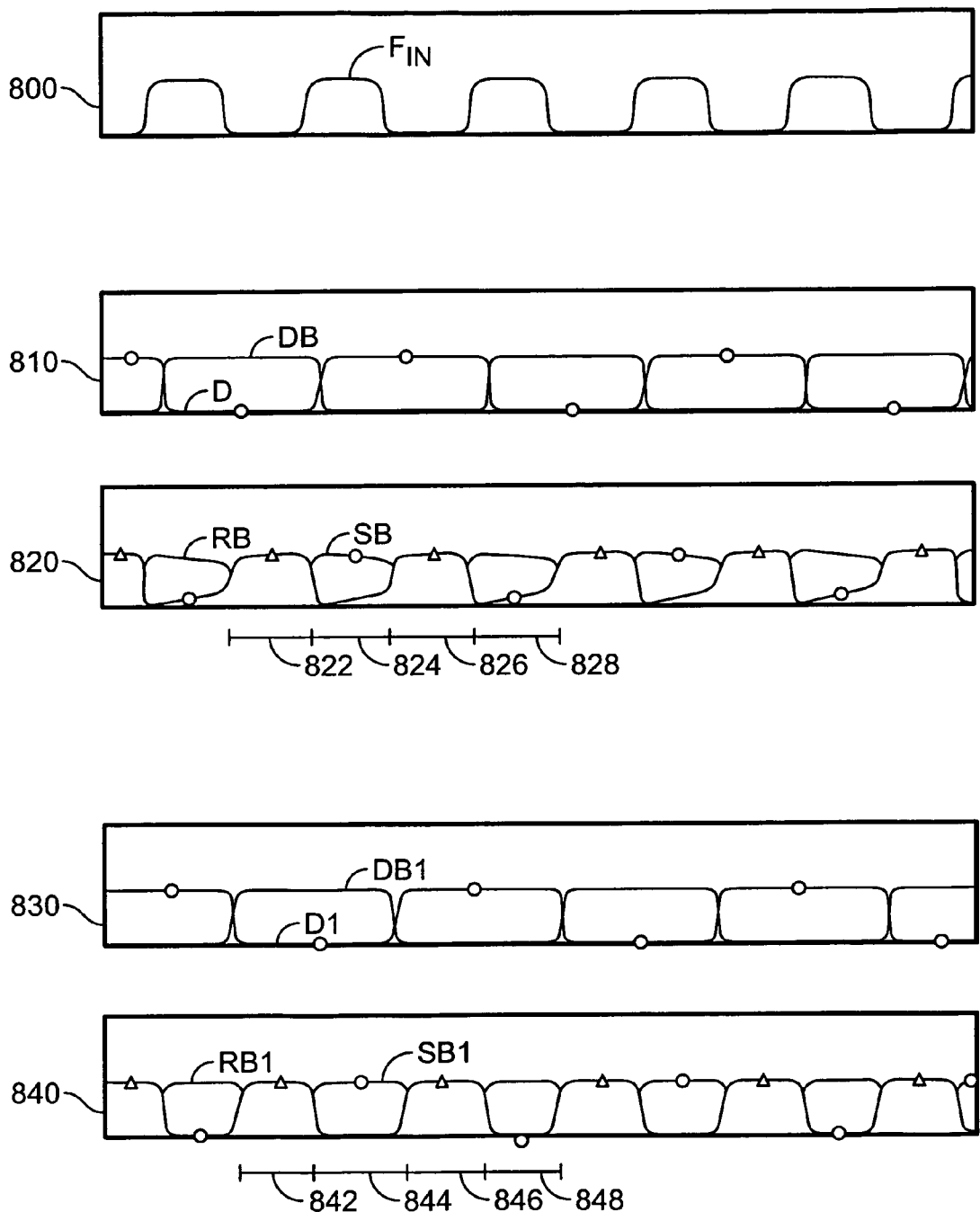

FIG. 8 shows timing diagrams comparing dynamic frequency divider circuit 300 using conventional SAFF 100/200 with the new dynamic frequency divider circuit 600 at a high frequency. Diagram 800 shows the clock signal $F_{IN}$.

Diagrams 810 and 820 show waveforms for circuit 300. Diagram 810 shows the differential input/feedback signals D and DB. Diagram 820 shows the signals at nodes RB and SB. When $F_{IN}$ is low, SAFF 310 is in the precharge phase. Signals D and DB are in a stable state and signals RB and SB are charged to the supply voltage $V_{DD}$ (e.g., at 822 and 826). When $F_{IN}$ is high, SAFF 100/200 is in the evaluation phase. When DB is high and D is low, at the next rising edge of $F_{IN}$, RB is discharged to ground and SB maintains its high state (e.g., at 824). When D is high and DB is low, at the next rising edge of $F_{IN}$, SB is discharged to ground and RB maintains its high state (e.g., at 828). Because $F_{IN}$ has a high frequency, SAFF 310 switches from the evaluation phase back to the precharge phase before the leakage can cause nodes RB and SB to change states.

Diagrams 830 and 840 show waveforms for circuit 600. Diagram 830 shows the differential input/feedback signals $D_1$ and $DB_1$ for the first flip-flop 610. Diagram 840 shows the signals at nodes $RB_1$ and $SB_1$ for the first flop-flop 610. Although not shown, the signals $D_2$, $DB_2$, $RB_2$, and $SB_2$ for the second flip-flop 620 are the corresponding signals from the first flip-flop 610 shifted by half a clock cycle. When $F_{IN}$ is low, flip-flop 610 is in the precharge phase. Signals $D_1$ and $DB_1$ are in a stable state and signals $RB_1$ and $SB_1$ are charged to the supply voltage $V_{DD}$ (e.g., at 842 and 844). When $F_{IN}$ is high, flip-flop 610 is in the evaluation phase. When $DB_1$ is high and $D_1$ is low, at the next rising edge of $F_{IN}$, $RB_1$ is discharged to ground and $SB_1$ maintains its high state (e.g., at 844). When $D_1$ is high and $DB_1$ is low, at the next rising edge of $F_{IN}$, $SB_1$ is discharged to ground and $RB_1$ maintains its high state (e.g., at 848). With the use of two flip-flops 610 and 620, signals $D_1$ and $DB_1$ maintain their states for one clock cycle (a precharge phase and corresponding evaluation phase), and thus do not affect the output states of flip-flops 610 and 620.

As shown by FIGS. 7-8, in circuit 300 using conventional SAFF 100/200 and circuit 600, the internal nodes maintain their states to generate correct output data for high frequencies. But at low frequencies, only circuit 600 can maintain the states of the internal nodes to generate correct output data. At low frequencies, circuit 300 using conventional SAFF 100/200 cannot maintain the states of the internal nodes because of leakage and the change in states of the input signals D and DB during the evaluation phase. In the architecture-level approach, circuit 600 prevents the input signals D and DB from changing states for one clock cycle so that even if leakage occurs, circuit 600 can operate at low and high frequencies over a wide frequency range.

Figure 9:
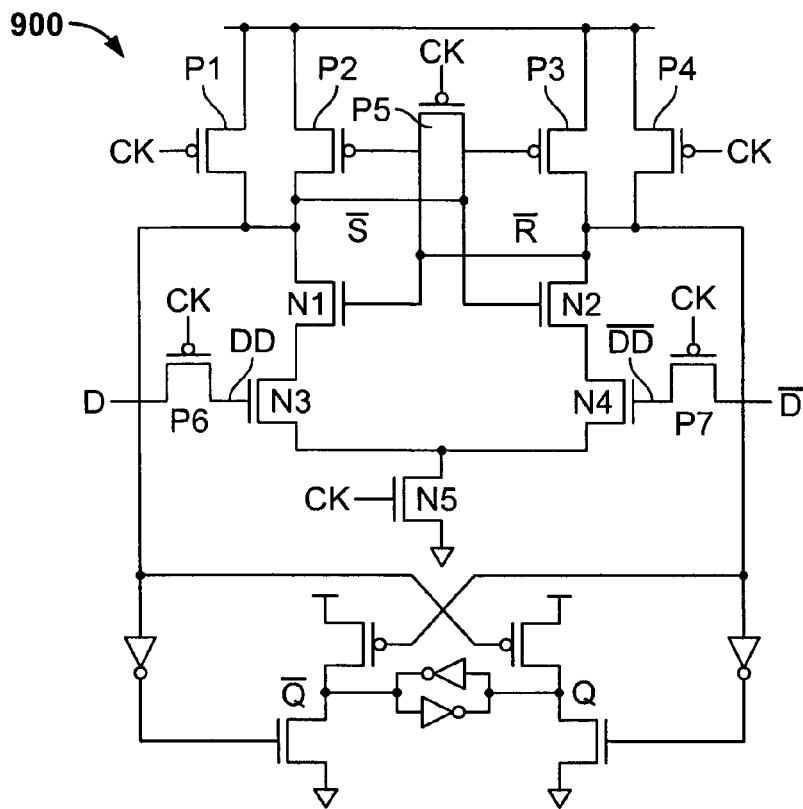
FIGS. 9-10 are circuit diagram of SAFFs in accordance with additional embodiments of the invention.

FIG. 9 illustrates a SAFF 900 that prevents the input data from changing states for one clock period in accordance with another embodiment of the invention. SAFF 900 can be used in dynamic frequency divider circuit 300 in accordance with the invention. In the circuit-level approach, two clocked PMOS transistors P6 and P7 are added to the data inputs. For PMOS transistor P6, the source is coupled to input signal D, the drain is coupled to the gate of NMOS transistor N3, and the gate is coupled to the clock signal CK. For PMOS transistor P7, the source is coupled to input signal DB, the drain is coupled to the gate of NMOS transistor N4, and the gate is coupled to the clock signal CK.

When the clock signal CK transitions from a high state to a low state, SAFF 900 enters the precharge phase and PMOS transistors P6 and P7 turn ON to allow the signals D and DB to be sent as input. When the clock signal CK transitions from a low state to a high state, circuit 900 enters the evaluation phase and PMOS transistors P6 and P7 turn OFF, capturing the signals D and DB at the gates of NMOS transistors N3 and N4 (e.g. at nodes DD and DDB), respectively. Even if input signals D and DB change states, circuit 900 will not read the state changes until PMOS transistors P6 and P7 turn ON at a next clock signal CK transition from a high state to a low state. Because SAFF 900 prevents the input signals D and DB from changing states for one clock cycle, even if leakage occurs, the internal states can be held to generate the correct output data.

Figure 10:
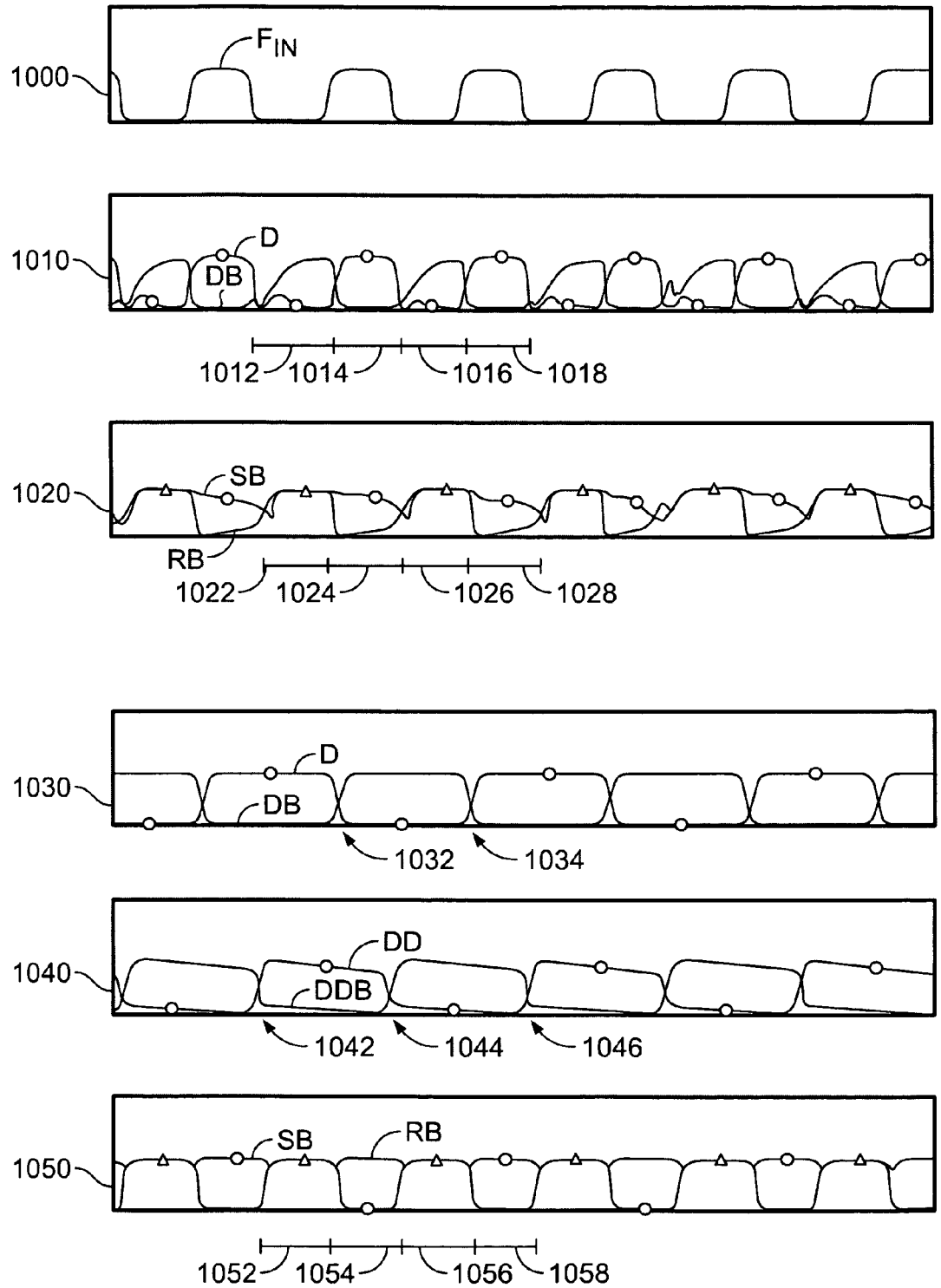

FIG. 10 shows timing diagrams comparing dynamic frequency divider circuit 300 using conventional SAFF 100/200 with new SAFF 900 at low frequencies. Diagram 1000 shows the clock signal $F_{IN}$.

Diagrams 1010 and 1020 show waveforms for the dynamic frequency divider circuit 300 using conventional SAFF 100/200. Diagram 1010 shows the differential input/feedback signals D and DB. Diagram 1020 shows the signals at nodes RB and SB. When $F_{IN}$ is low, SAFF 100/200 is in the precharge phase. Signals D and DB are being brought to their intended state via the feedback loops from respective outputs QB and Q (e.g., at 1012 and 1016) and signals RB and SB are charged to the supply voltage $V_{DD}$ (e.g., at 1022 and 1026). When $F_{IN}$ is high, SAFF 100/200 is in the evaluation phase. When DB is high and D is low, at the next rising edge of $F_{IN}$, RB is discharged to ground and SB attempts to maintain its high state (e.g., at 1024 and 1028). However, during the evaluation phase, signals D and DB change states (e.g., at 1014 and 1018). This change in states, further compounded by leakage, causes a rise in voltage at node RB and a drop in voltage at node SB (e.g., at 1024 and 1028), thus affecting the output states of SAFF 100/200. Signals D and DB change states because the output signals Q and QB generated by SAFF 100/200 are fed back to input signals DB and D, respectively, during the evaluation phase. The signal transitions for inputs D and DB (e.g., at 1016) are caused by errors in signals SB and RB due to leakage (e.g., at 1024). Although not shown, RB and SB follow a similar pattern when DB is low and D is high during the precharge phase, but changes states during the evaluation phase.

Diagrams 1030, 1040, and 1050 show waveforms for dynamic frequency divider circuit 300 using new SAFF 900. Diagram 1030 shows the differential input/feedback signals D and DB. Diagram 1040 shows the clocked signals at nodes DD and DDB. Diagram 1050 shows the signals at nodes RB and SB. When $F_{IN}$ transitions from a high state to a low state, SAFF 900 enters the precharge phase. PMOS transistors P6 and P7 turn ON and signals D and DB are sent at input to NMOS transistors N3 and N4, respectively (e.g., at 1042, 1044, and 1046). Signals RB and SB are charged to the supply voltage $V_{DD}$ (e.g., at 1052 and 1054). When $F_{IN}$ transitions from the low state to the high state, SAFF 900 enters the evaluation phase. PMOS transistors P6 and P7 turn OFF, thus capturing the states of input signals D and DB during the low state at nodes DD and DDB, respectively. Even when input signals D and DB change states (e.g., at 1032 and 1034), nodes DD and DDB maintain the states of input signals D and DB prior to the change in states. When DD is high and DDB is low, at the next rising edge of $F_{IN}$, SB is discharged to ground and RB maintains its high state (e.g., at 1054). When DDB is high and DD is low, at the next rising edge of $F_{IN}$, RB is discharged to ground and SB maintains its high state (e.g., at 1058). Although leakage may occur, nodes RB and SB are able to maintain their states because nodes DD and DDB are able to maintain the states of the input signals D and DB, respectively, for one clock period.

Figure 11:
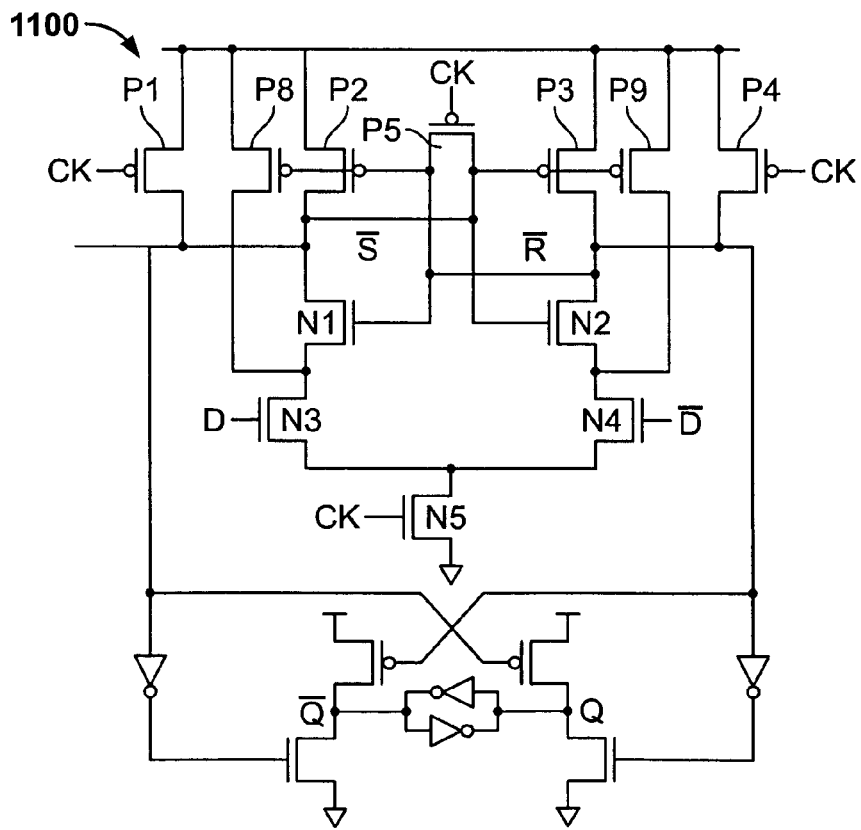
FIGS. 11-12 show timing diagrams of the conventional SAFFs and the SAFFs of FIGS. 9-10 in the frequency divider circuit of FIG. 3 in accordance with the additional embodiments of the invention.

FIG. 11 illustrates a SAFF 1100 that counteracts the leakage attributable to the NMOS transistors in accordance with yet another embodiment of the invention. SAFF 1100 can be used in dynamic frequency divider circuit 300 in accordance with the invention. In the circuit-level approach, two pull-up PMOS transistors are added. PMOS transistor P8 is coupled across PMOS transistor P2 and NMOS transistor N1, and has the same gate input as transistor P2. PMOS transistor P9 is coupled across PMOS transistor P3 and NMOS transistor N2, and has the same gate input as transistor P3. The source of PMOS transistors P8 and P9 is the source voltage $V_{DD}$.

When signal D is high and signal DB is low, when the clock signal CK transitions from a low state to a high state, NMOS transistors N1, N3, and N5 turn ON to discharge signal SB to ground while PMOS transistors P3 and P9 turn ON to maintain the high state of signal RB. Because P9 is turned ON, the node between NMOS transistors N2 and N4 is at about the source voltage. Even if N2 leaks current, N2 allows positive current to flow across, thereby boosting signal RB. Similarly, when signal DB is high and signal D is low, when the clock signal CK transitions from a low state to a high state, NMOS transistors N2, N4, and N5 turn ON to discharge signal RB to ground while PMOS transistors P2 and P8 turn ON to maintain the high state of signal SB. Because P8 is turned ON, the node between NMOS transistors N1 and N3 is at about the source voltage. Even if N1 leaks current, N1 allows positive current to flow across, thereby boosting signal SB.

Figure 12:
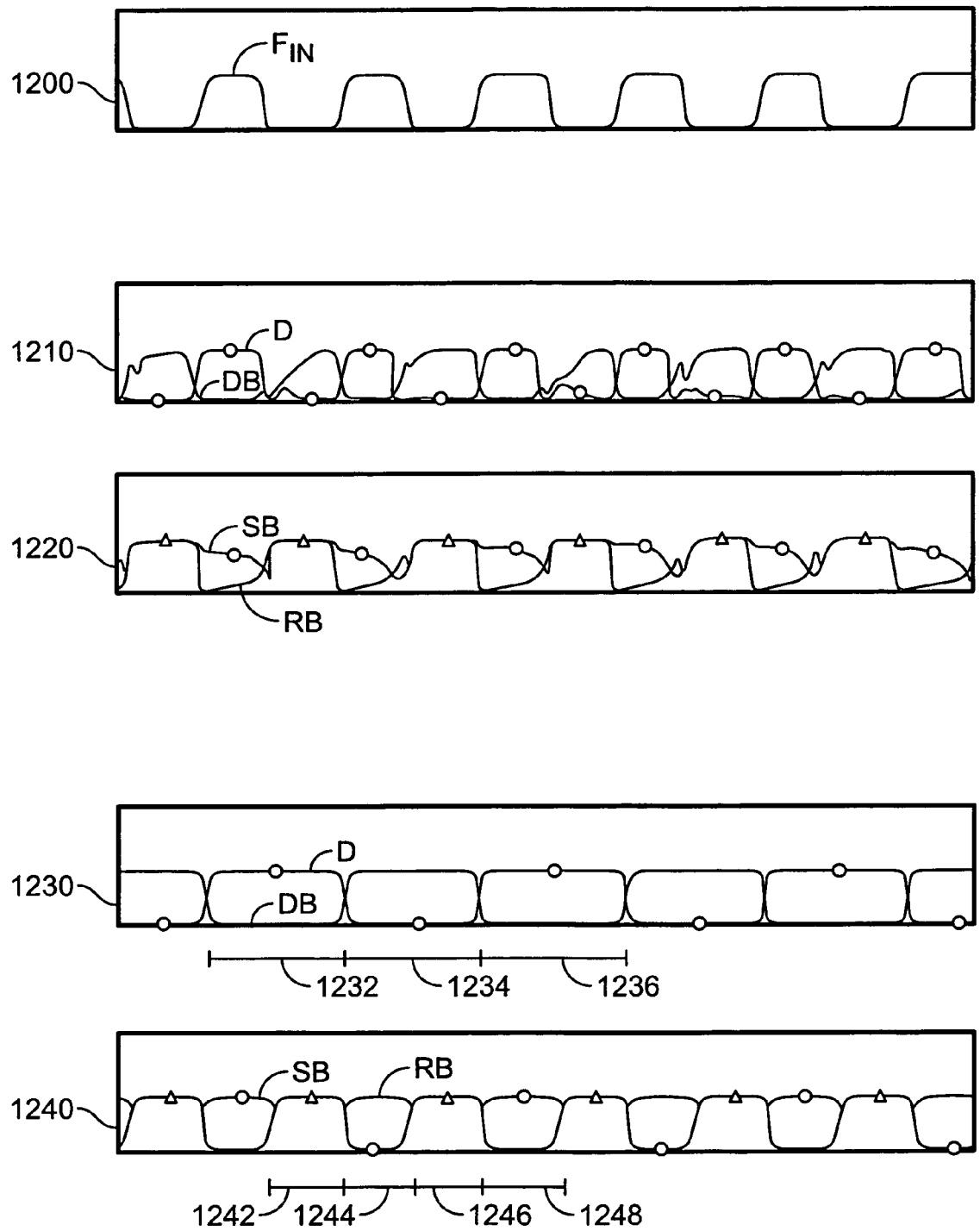

FIG. 12 shows timing diagrams comparing dynamic frequency divider circuit 300 using conventional SAFF 100/200 with the new SAFF 1100 at low frequencies. Diagram 1200 shows the clock signal $F_{IN}$.

Diagrams 1210 and 1220 show waveforms for dynamic frequency divider circuit 300 using conventional SAFF 100/200. Diagrams 1210 and 1220 are similar to waveforms 1010 and 1020, respectively, which have been described in connection with FIG. 10.

Diagrams 1230 and 1240 show waveforms for dynamic frequency divider circuit 300 using new SAFF 1100. Diagram 1230 shows the differential input/feedback signals D and DB. Diagram 1240 shows the signals at nodes RB and SB. When $F_{IN}$ is low, SAFF 1100 is in the precharge phase. Signals D and DB are in a stable state and signals RB and SB are charged to the supply voltage $V_{DD}$ (e.g., at 1242 and 1246). When $F_{IN}$ is high, SAFF 1100 is in the evaluation phase. When D is high and DB is low, at the next rising edge of $F_{IN}$, SB is discharged to ground and RB maintains its high state (e.g., at 1244). When DB is high and D is low, at the next rising edge of $F_{IN}$, RB is discharged to ground and SB maintains its high state (e.g., at 1248). Although inputs D and DB changes states during the evaluation phase, nodes RB and SB are able to maintain their states because the leakage effect has been reduced.

As shown by FIGS. 10 and 12, dynamic frequency divider circuit 300 using conventional SAFF 100/200 cannot maintain the states of the internal nodes at low frequencies because of leakage and the change in states of the input signals D and DB during the evaluation phase. In the circuit-level approach using additional clocked PMOS transistors, dynamic frequency divider circuit 300 using new SAFF 900 prevents the input signals from changing states during the evaluation phase so that even if leakage occurs, the circuit can operate at low and high frequencies over a wide frequency range. In the circuit-level approach using additional pull-up PMOS transistors, dynamic frequency divider circuit 300 using new SAFF 1100 reduces the leakage effect so that even if the input signals change states during the evaluation phase, the circuit can operate at low and high frequencies over a wide frequency range.

SAFFs 900 and/or 1100 are used in the dynamic frequency divider circuit 300. Alternatively, to provide a more robust circuit, SAFFs 900 and/or 1100 can be used in frequency divider circuit 600 (in either or both flip-flops 610 and 620) to provide less leakage and to prevent the input signals D and DB from changing states during the evaluation phase.

Dynamic frequency divider circuits in accordance with the different embodiments of the invention are used in a wide variety of high performance designs in CMOS technology. This CMOS technology is utilized in many different types of integrated circuits (ICs) such as, for example, programmable logic devices (PLDs), complex programmable logic devices (CPLDs), erasable programmable logic devices (EPLDs), electrically erasable programmable logic devices (EEPLDs), field programmable gate arrays (FPGAs), application-specific standard products (ASSPs), application-specific integrated circuits (ASICs), or other suitable ICs.

Figure 13:
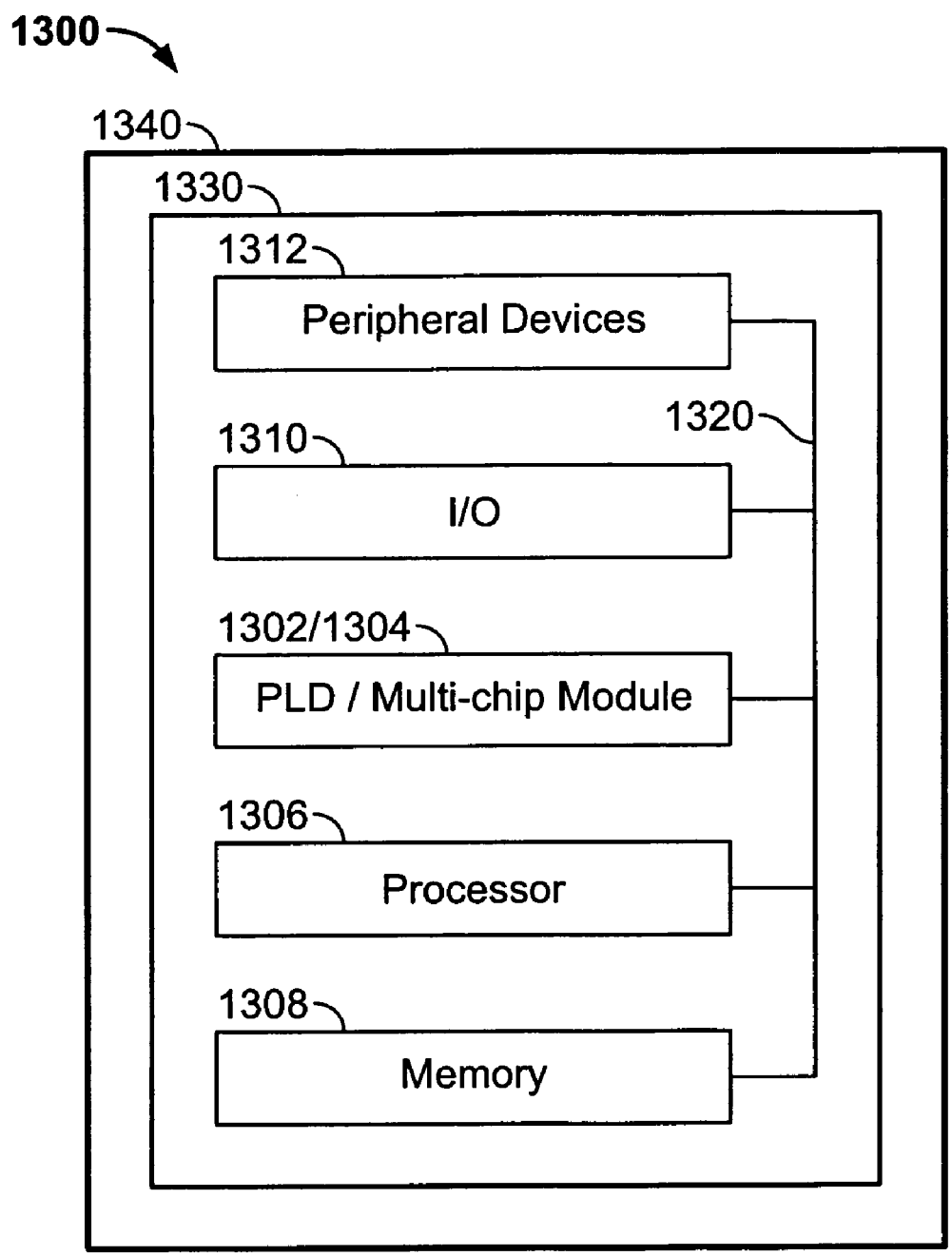
FIG. 13 is a simplified block diagram of an illustrative system employing circuitry in accordance with an embodiment of the invention.

FIG. 13 illustrates a PLD/multi-chip module 1302/1304 having implemented thereon a dynamic frequency divider circuit in a data processing system 1300 in accordance with the different embodiments of the invention. Data processing system 1300 may include one or more of the following components: a processor 1306; memory 1308; input/output circuitry 1310; and peripheral devices 1312. These components are coupled together by a system bus 1320 and are populated on a circuit board 1330 which is contained in an end-user system 1340.

System 1300 can be used in a wide variety of applications, such as computer networking, data networking, instrumentation, video processing, digital signal processing, or any other application where the advantage of using programmable or reprogrammable logic is desirable. PLD/multi-chip module 1302/1304 can be used to perform a variety of different logic functions. For example, PLD/multi-chip module 1302/1304 can be configured as a processor or controller that works in cooperation with processor 1306. PLD/multi-chip module 1302/1304 may also be used as an arbiter for arbitrating access to a shared resource in system 1300. In yet another example, PLD/multi-chip module 1302/1304 can be configured as an interface between processor 1306 and one of the other components in system 1300. It should be noted that system 1300 is only exemplary, and that the true scope and spirit of the invention should be indicated by the following claims.

Thus, dynamic frequency divider circuits are provided that operate at low and high frequencies over a wide frequency range by (1) preventing the input signals from changing states for one clock period, (2) counteracting the subthreshold leakage across the transistors, or (3) a combination of both. One skilled in the art will appreciate that the present invention can be practiced by other than the described embodiments, which are presented for purposes of illustration and not of limitation, and the present invention is limited only by the claims which follow.

What is claimed is:

1. A dynamic frequency divider circuit comprising:
   a first positive-channel metal-oxide semiconductor (PMOS) transistor having a first source, a first gate, and a first drain;
   a second PMOS transistor having a second source, a second gate, and a second drain, wherein the first gate and the second gate are coupled to receive a first signal having a first frequency; and
   a sense amplifier based flip-flop comprising a first input coupled to the first drain, a second input coupled to the second drain, a third input coupled to receive the first signal, a first output coupled to the second source, and a second output coupled to the first source, wherein the first output generates a second signal having a second frequency that is a multiple of the first frequency.

2. The circuit of claim 1 wherein when the first signal is binary "0":
   the first PMOS transistor is turned on allowing a first bit value from the first source to be sent to the first input;
   the second PMOS transistor is turned on allowing a second bit value from the second source to be sent to the second input; and
   the sense amplifier is precharged to a supply voltage.

3. The circuit of claim 2 wherein when the first signal is binary "1:"
   the first and the second PMOS transistors are turned off;
   the first input is held at the first bit value; and
   the second input is held at the second bit value.

4. The circuit of claim 3 wherein when the first bit value is binary "0" and the second bit value is binary "1:"
   the first output is discharged to a ground voltage; and
   the second output is held at the supply voltage.

5. The circuit of claim 3 wherein when the first bit value is binary "1" and the second bit value is binary "0:"
   the first output is held at the supply voltage; and
   the second output is discharged to a ground voltage.

6. A dynamic frequency divider circuit comprising:

a sense amplifier based flip-flop comprising (1) a sense amplifier having a cross-coupled inverter and (2) a set-reset latch coupled to the sense amplifier, the sense amplifier based flip-flop having a first input, a second input, a third input coupled to receive a first signal having a first frequency, a first output coupled to the second input, and a second output coupled to the first input, wherein the first output generates a second signal having a second frequency that is a multiple of the first frequency;

a first positive-channel metal-oxide semiconductor (PMOS) transistor coupled across a first half of the cross-coupled inverter, and operative to pull-up the voltage at a first output of the sense amplifier when the first output is binary "1;" and a second PMOS transistor coupled across a second half of the cross-coupled inverter, and operative to pull-up the voltage at the second output of the sense amplifier when the second output is binary "1."

7. The circuit of claim 6 wherein:

when the first signal is binary "0," the sense amplifier is operative to precharge the first output and the second output of the sense amplifier to a supply voltage; and when the first signal is binary "1," the sense amplifier is operative to amplifier a difference between the first input and the second input of the sense amplifier based flip-flop at the first output and the second output of the sense amplifier.

8. The circuit of claim 7 wherein the set-reset latch is operative to:

hold the first output of the sense amplifier at the first output of the sense amplifier based flip-flop; and hold the second output of the sense amplifier at the second output of the sense amplifier based flip-flop.

9. The circuit of claim 6 wherein when the first input is binary "0," the second input is binary "1," and the first signal transitions to binary "1:"

the first output of the sense amplifier is discharged to a ground voltage;

the second output of the sense amplifier is held at the supply voltage; and the second PMOS transistor is turned on to hold the second output of the sense amplifier at the supply voltage.

10. The circuit of claim 6 wherein when the first input is binary "1," the second input is binary "0," and the first signal transitions to binary "1:"

the first output of the sense amplifier is held at the supply voltage;

the second output of the sense amplifier is discharged to a ground voltage; and the first PMOS transistor is turned on to hold the first output of the sense amplifier at the supply voltage.

* * * * *